US010937634B2

United States Patent
Chen et al.

(10) Patent No.: US 10,937,634 B2
(45) Date of Patent: Mar. 2, 2021

(54) TUNABLE UPPER PLASMA-EXCLUSION-ZONE RING FOR A BEVEL ETCHER

(71) Applicant: Lam Research Corporation, Fremont, CA (US)

(72) Inventors: Jack Chen, San Francisco, CA (US); Adam Liron, Pleasanton, CA (US); Gregory Sexton, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1043 days.

(21) Appl. No.: 14/046,206

(22) Filed: Oct. 4, 2013

(65) Prior Publication Data
US 2015/0099365 A1  Apr. 9, 2015

(51) Int. Cl.
| | |
|---|---|
| *H01J 37/32* | (2006.01) |
| *H01L 21/02* | (2006.01) |
| *H01L 21/67* | (2006.01) |

(52) U.S. Cl.
CPC .. *H01J 37/32385* (2013.01); *H01J 37/32091* (2013.01); *H01J 37/32642* (2013.01);
(Continued)

(58) Field of Classification Search
CPC .......... H01L 21/02087; H01L 21/3065; H01L 21/67069; H01J 37/32091;
(Continued)

(56) References Cited

U.S. PATENT DOCUMENTS

| | | | |
|---|---|---|---|
| 6,824,627 B2 | 11/2004 | Dhindsa et al. | |
| 7,316,761 B2 * | 1/2008 | Doan | H01J 37/32009 |
| | | | 118/715 |

(Continued)

FOREIGN PATENT DOCUMENTS

| | | | |
|---|---|---|---|
| JP | 2004296553 A | * | 10/2004 |
| TW | 200945436 A | | 11/2009 |

OTHER PUBLICATIONS

Taiwanese Office Action and Search Report in Taiwanese Application No. 103134639 dated Jul. 9, 2018, 8 pages.

*Primary Examiner* — Benjamin Kendall

(57) ABSTRACT

A bevel etcher for cleaning a bevel edge of a semiconductor substrate with plasma includes a lower electrode assembly having a lower support having a cylindrical top portion. An upper dielectric component is disposed above the lower electrode assembly having a cylindrical bottom portion opposing the top portion of the lower support. A tunable upper plasma exclusion zone (PEZ) ring surrounds the bottom portion of the dielectric component, wherein a lower surface of the tunable upper PEZ ring includes an upwardly tapered outer portion extending outwardly from the bottom portion of the upper dielectric component, wherein a vertical height of an adjustable gap between the lower surface of the upper PEZ ring and an upper surface of a substrate supported on the lower support can be increased or decreased such that the extent of the bevel edge of the substrate to be cleaned by the plasma can respectively be adjusted radially inward or radially outward. At least one radio frequency (RF) power source is adapted to energize process gas into the plasma during a bevel edge cleaning process.

19 Claims, 9 Drawing Sheets

(52) U.S. Cl.
CPC .. *H01L 21/02087* (2013.01); *H01L 21/67069* (2013.01); *Y10T 29/49817* (2015.01)

(58) Field of Classification Search
CPC ............. H01J 37/32385; H01J 37/3244; H01J 37/32449; H01J 37/32541; H01J 37/32568; H01J 37/32642; H01J 2237/334; H01J 2237/3341; H05H 2001/4675; Y10T 29/49817
See application file for complete search history.

(56) References Cited

U.S. PATENT DOCUMENTS

| | | | |
|---|---|---|---|
| 7,438,765 B2 | 10/2008 | Park et al. | |
| 7,691,277 B2 * | 4/2010 | Suzuki | H01J 37/32623 134/1 |
| 7,858,898 B2 | 12/2010 | Bailey, III et al. | |
| 7,909,960 B2 | 3/2011 | Kim et al. | |
| 7,943,007 B2 | 5/2011 | Bailey, III et al. | |
| 7,951,261 B2 | 5/2011 | Jeon | |
| 7,977,123 B2 | 7/2011 | Fischer et al. | |
| 8,083,890 B2 | 12/2011 | Fang et al. | |
| 8,137,501 B2 | 3/2012 | Kim et al. | |
| 8,262,923 B2 | 9/2012 | Fang et al. | |
| 8,323,523 B2 | 12/2012 | Fang et al. | |
| 8,328,980 B2 | 12/2012 | Saldana et al. | |
| 8,349,202 B2 | 1/2013 | Fang et al. | |
| 8,398,778 B2 | 3/2013 | Fang et al. | |
| 8,562,750 B2 | 10/2013 | Chen et al. | |
| 2007/0068623 A1 | 3/2007 | Kim et al. | |
| 2008/0179010 A1 * | 7/2008 | Bailey, III | H01L 21/02087 156/345.43 |
| 2008/0179297 A1 * | 7/2008 | Bailey | H01J 37/32366 219/69.15 |
| 2008/0182412 A1 * | 7/2008 | Bailey, III | H01J 37/32366 438/689 |
| 2008/0227301 A1 * | 9/2008 | Fang | H01J 37/32642 438/706 |
| 2009/0166326 A1 | 7/2009 | Sexton et al. | |
| 2009/0170334 A1 | 7/2009 | Fang et al. | |
| 2009/0188627 A1 * | 7/2009 | Fang | H01J 37/32091 156/345.43 |
| 2010/0116437 A1 * | 5/2010 | Murakami | H01J 37/32541 156/345.43 |
| 2011/0049101 A1 | 3/2011 | Juco et al. | |
| 2011/0146703 A1 * | 6/2011 | Chen | H01L 21/3083 134/1.1 |
| 2011/0206833 A1 * | 8/2011 | Sexton | H01J 37/32532 427/78 |
| 2011/0214687 A1 | 9/2011 | Bailey, III et al. | |
| 2011/0275219 A1 | 11/2011 | Fang et al. | |
| 2013/0056078 A1 | 3/2013 | Saldana et al. | |

* cited by examiner

TUNABLE UPPER PLASMA-EXCLUSION-ZONE RING FOR A BEVEL ETCHER

FIELD OF THE INVENTION

The present invention relates to a bevel etcher, and more specifically to a tunable upper plasma-exclusion-zone (PEZ) ring for a bevel etcher.

BACKGROUND

Integrated circuits are formed from a semiconductor substrate over which are formed patterned microelectronics layers. In the processing of the substrate, plasma is often employed to etch intended portions of films deposited on the substrate. Typically, etch plasma density is lower near the edge of the substrate, which may result in accumulation of a poly-silicon layer, a nitride layer, a metal layer, etc. (collectively referred to as byproduct layer or etch byproduct) on the top and bottom surfaces of the substrate bevel edge. As successive byproduct layers are deposited on the top and bottom surfaces of the substrate bevel edge as a result of several different etch processes, the bonds between the byproduct layers and the substrate will eventually weaken and the byproduct layers may peel or flake off, often onto other substrates during substrate transport and thereby contaminate other substrates being processed.

SUMMARY

Disclosed herein is a bevel etcher for cleaning a bevel edge of a semiconductor substrate with plasma which includes a lower electrode assembly having a lower support having a cylindrical top portion. An upper dielectric component is disposed above the lower electrode assembly having a cylindrical bottom portion opposing the top portion of the lower support. A tunable upper plasma exclusion zone (PEZ) ring surrounds the bottom portion of the dielectric component, wherein a lower surface of the tunable upper PEZ ring includes an upwardly tapered outer portion extending outwardly from the bottom portion of the upper dielectric component, wherein a vertical height of an adjustable gap between the lower surface of the upper PEZ ring and an upper surface of a substrate supported on the lower support can be increased or decreased such that the extent of the bevel edge of the substrate to be cleaned by the plasma can respectively be adjusted radially inward or radially outward. At least one radio frequency (RF) power source is adapted to energize process gas into the plasma during a bevel edge cleaning process.

Also disclosed herein is a tunable upper PEZ ring configured to adjust etch distance during bevel edge cleaning in a plasma bevel etcher wherein the tunable upper PEZ ring is configured to surround an upper dielectric component, the tunable upper PEZ ring comprising: a lower surface which includes an upwardly tapered portion extending outwardly from a bottom portion of the dielectric component.

BRIEF DESCRIPTION OF THE DRAWING FIGURES

DETAILED DESCRIPTION

Figure 1A:
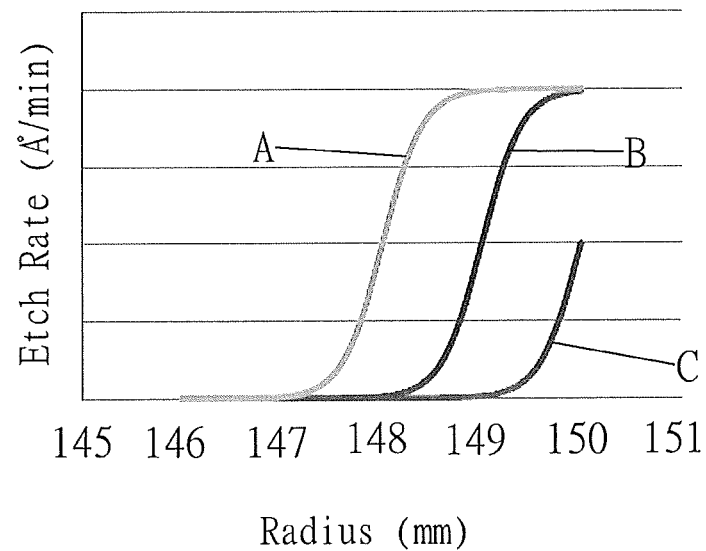
FIGS. 1A-1C show graphs of bevel etch rates along the radius of a 300 mm substrate.

In the following description, numerous specific details are set forth in order to provide a thorough understanding of embodiments described herein. However, it will be apparent to one skilled in the art that the embodiments described herein may be practiced without some of these specific details. In other instances, implementation details and process operations have not been described in detail, if already well known. Additionally, as used herein, the term "about" refers to ±10%.

Embodiments disclosed herein relate to a bevel etcher having a bevel etching chamber useful for cleaning the bevel edge of a semiconductor substrate. More specifically embodiments disclosed herein relate to an upper electrode assembly of a bevel etcher which includes a tunable upper plasma-exclusion-zone (PEZ) ring which can surround a bottom portion of a dielectric component disposed above a lower support (i.e. a lower electrode assembly) which is adapted to support a semiconductor substrate. The lower surface of the tunable upper PEZ ring includes an upwardly tapered portion extending outwardly from the bottom portion of the dielectric component. Preferably, the lower surface of the tunable upper PEZ ring 302 preferably includes a horizontal portion 351 and the upwardly tapered portion 350 extending outwardly from the horizontal portion (see FIG. 4). Further, a vertical height of an adjustable gap between the lower surface of the upper PEZ ring, preferably the horizontal portion of the lower surface, and an upper surface of a substrate supported on the lower support can be increased or decreased such that the extent of the bevel edge of the substrate to be cleaned by the plasma can respectively be adjusted radially inward or radially outward, and thereby the etch distance achieved by the bevel etcher during a bevel etch process can be varied. Hereinafter, the term PEZ refers to a radial distance from the center of the substrate to the outer edge of the area of the substrate where plasma for cleaning the bevel edge is excluded.

Etch distance is the length between the bevel edge apex of the substrate and the radius on the substrate at which deposited films are removed during a given bevel etching process. Etch distance is a function of the diameter and geometry of an upper PEZ ring as well as the gap spacing (i.e. the vertical height of an adjustable gap) between a horizontal lower surface of the upper PEZ ring and an upper surface of the substrate located below the upper PEZ ring. Etch distance can be controlled (i.e. tuned) through a tunable upper PEZ ring by adjusting the gap spacing between a horizontal portion of the lower surface of the tunable upper PEZ ring and an upper surface of the substrate wherein the diameter and geometry of the tunable upper PEZ ring are fixed. In this manner, etch distance can be adjusted without having to transfer the substrate to a new bevel etching chamber or having to remove an upper PEZ ring from the bevel etching chamber and replace the removed upper PEZ ring with a different upper PEZ ring which has a suitable diameter and geometry to meet a desired etch distance required for a respective subsequent bevel etching process.

When the outer diameter of a horizontal lower surface of the upper PEZ ring increases, the area of the substrate exposed to plasma during a bevel etching process is reduced and the etch distance decreases. This correlation is linear at a ratio of about 1:1 between a non-tunable upper PEZ ring radius and etch distance. For example, FIG. 1A shows a graph of computer modeled bevel etch rates (y-axis) along the radius (x-axis) of a 300 mm substrate wherein three non-tunable upper PEZ rings, which have varying outer diameters, are used to bevel etch the substrate, and wherein the vertical height of the gap between a horizontal lower surface of each non-tunable upper PEZ ring and an upper surface of the substrate is fixed. Line A shows a first non-tunable upper PEZ ring which has an outer diameter of the horizontal lower surface of 296.0 mm, line B shows a second non-tunable upper PEZ ring which has an outer diameter of the horizontal lower surface of 298.0 mm, and line C shows a third non-tunable upper PEZ ring which has an outer diameter of the horizontal lower surface of 300.0 mm. As shown, etch rates along the radius of each substrate vary as a function of the outer diameter of the horizontal lower surface of each ring.

Figure 1B:
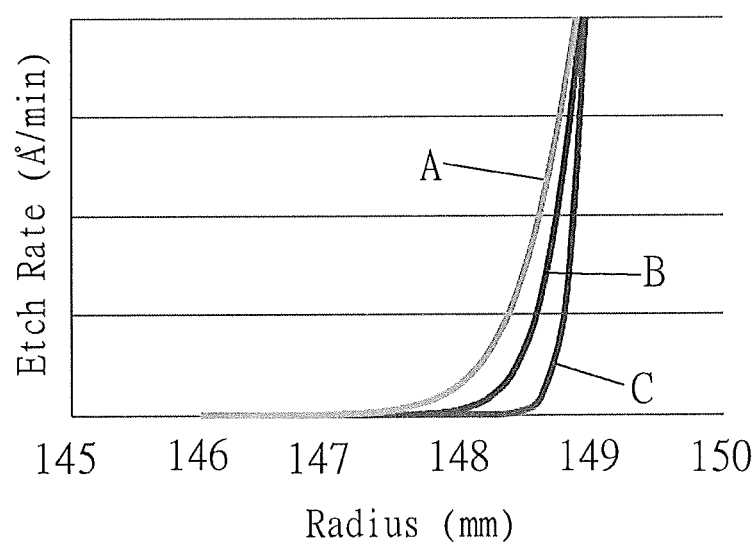

Further, as the vertical height of the adjustable gap increases, plasma can encroach further towards the center of the substrate during a bevel etching process, and the etch distance increases. This correlation is also linear, but changes in vertical height of the adjustable gap alone do not provide an adequate range of etch distances for many bevel etching processes which previously required desired etch distances to be achieved by installing non-tunable upper PEZ rings with different diameters to meet the desired etch distance. FIG. 1B shows a graph of computer modeled bevel etch rates (y-axis) along the radius (x-axis) of a 300 mm substrate wherein a single non-tunable upper PEZ ring, which has an outer diameter of a horizontal lower surface of 298.0 mm, is used to bevel etch a substrate wherein the vertical height of the adjustable gap between the horizontal lower surface of the non-tunable upper PEZ ring and an upper surface of the substrate is varied. Line A shows a vertical height of the adjustable gap of 0.60 mm, line B shows a vertical height of the adjustable gap of 0.40 mm, and line C shows a vertical height of the adjustable gap of 0.20 mm. As shown, etch rates along the radius of a substrate vary as a function of the vertical height of the adjustable gap between the horizontal lower surface of the non-tunable upper PEZ ring and the upper surface of the substrate.

Figure 1C:
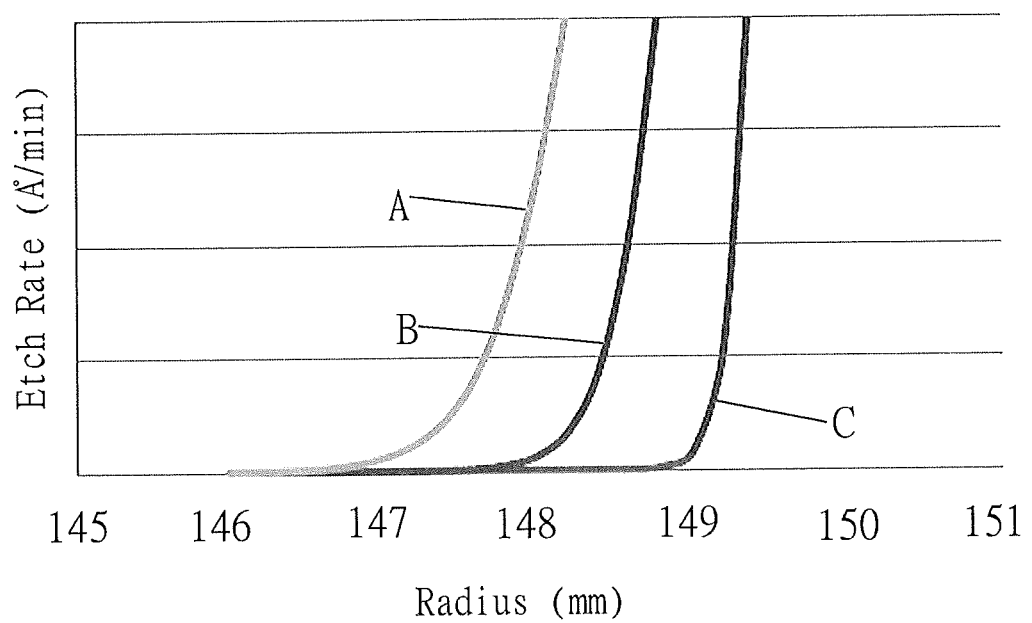

However, by using a tunable upper PEZ ring which has a lower surface that includes a horizontal portion and an upwardly tapered portion extending outwardly from the horizontal portion, etch distance can be controlled by adjusting the vertical height of the adjustable gap between the lower surface of the horizontal portion of the upper PEZ ring and an upper surface of a substrate wherein increasing or decreasing the vertical height of the adjustable gap respectively adjusts the extent of the bevel edge (i.e. controls etch distance) to be cleaned by the plasma during a bevel etching process radially inward or radially outward. FIG. 1C shows a graph of computer modeled bevel etch rates (y-axis) along the radius (x-axis) of a 300 mm substrate wherein a single tunable upper PEZ ring is used to bevel etch a substrate and wherein the vertical height of an adjustable gap between a the lower surface of the horizontal portion of the tunable upper PEZ ring and an upper surface of the substrate is varied. In the example shown in FIG. 1C, the upwardly tapered portion of the lower surface of the tunable upper PEZ ring has an upward taper angle θ equal to about 20° with respect to the horizontal portion. Line A shows a gap spacing of about 0.60 mm, line B shows a gap spacing of about 0.40 mm, and line C shows a gap spacing of about 0.20. Thus, a single tunable upper PEZ ring (see FIG. 1C below) can replicate the behavior of the three non-tunable upper PEZ rings (see FIG. 1A), that have different outer diameters of their respective horizontal lower surfaces, by adjusting the vertical height of an adjustable gap between the horizontal portion of the lower surface of the tunable PEZ ring and the upper surface of the substrate. In this manner, the tunable upper PEZ ring in the bevel etcher can perform multiple bevel etching processes which require different etch distances in a single chamber without having to replace the upper PEZ ring or transfer the substrate into a new bevel etching chamber each time a new etch distance is required.

When the vertical height of the adjustable gap between the horizontal portion of the lower surface of the tunable upper PEZ ring and the upper surface of the substrate is varied, the effective radius (p(g)) of the tunable upper PEZ ring will also vary as a function of the angle θ of the taper of the upwardly tapered portion of the lower surface of the tunable upper PEZ ring. Thus, the effective radius of the tunable upper PEZ ring which limits the extent of the bevel edge to be cleaned can be determined by the relationship between the outer radius of the horizontal portion (p) of the lower surface of the tunable upper PEZ ring, the angle θ of the upwardly tapered portion of the lower surface of the tunable upper PEZ ring, and the vertical height of the adjustable gap (g) between the horizontal portion of the lower surface of the tunable upper PEZ ring and the upper surface of the substrate to be bevel etched. This relationship can be determined by Equation 1 given below.

$$p(g)=p-g/\tan(\theta) \quad \text{Equation 1:}$$

In this manner, the tuning sensitivity, which is the ratio between etch distance and gap spacing, can be increased from about 0.65:1 for a non-tapered upper PEZ ring to about 6:1 for a tunable upper PEZ ring which has an upward taper angle θ equal to about 10° with respect to the horizontal portion, or about 2.2:1 for a tunable upper PEZ ring which has an upward taper angle θ equal to about 20° with respect to the horizontal portion. By providing a tunable upper PEZ ring with a large tuning sensitivity range, the bevel etcher can perform multiple bevel etching processes on different batches of substrates which require different etch distances in a single chamber without having to replace the upper PEZ ring each time a new etch distance is required. Preferably the tuning sensitivity of the tunable upper PEZ ring is about 1:1 to 10:1.

Figure 2:
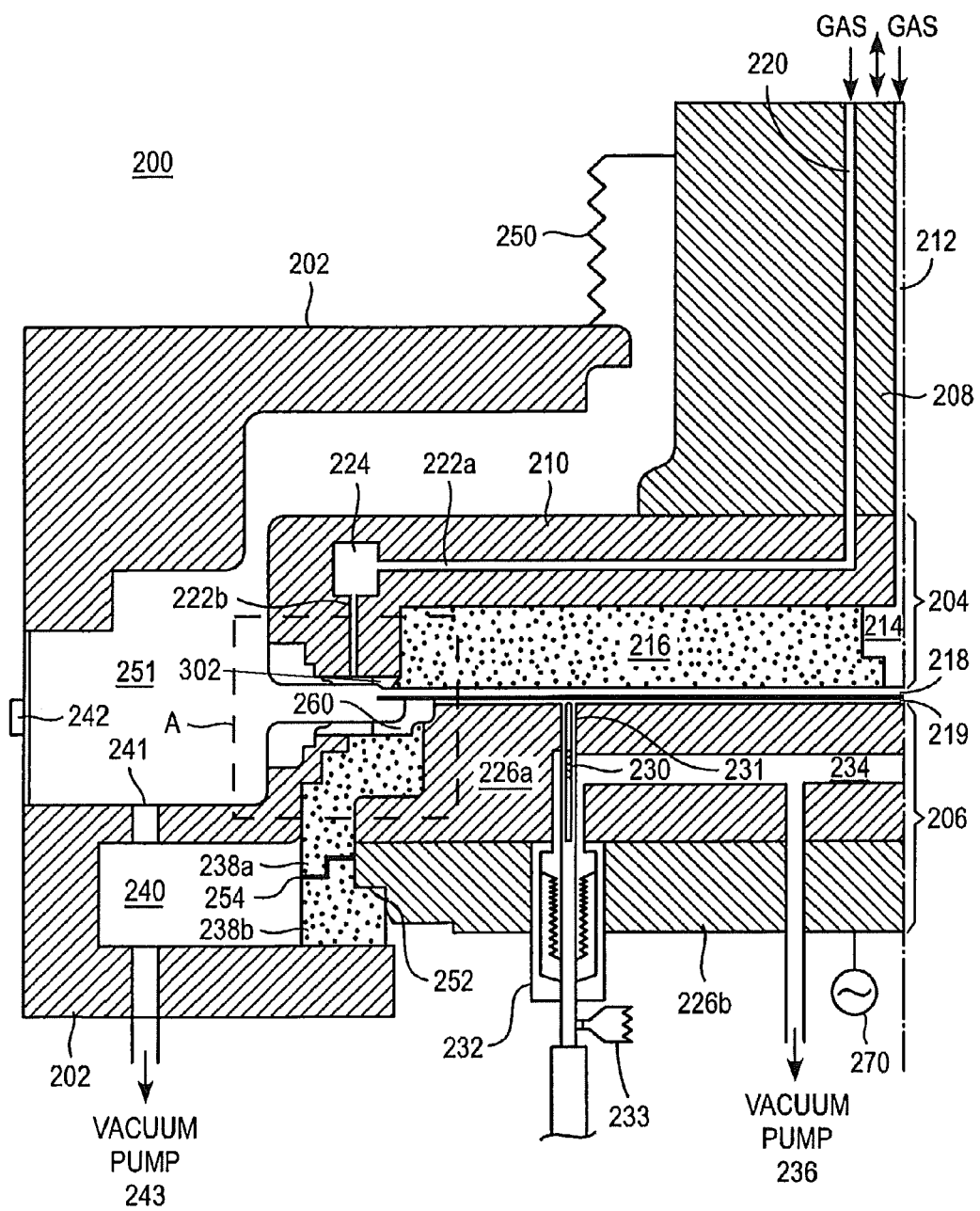
FIG. 2 illustrates a plasma bevel etcher according to embodiments disclosed herein.

FIG. 2 shows a schematic cross sectional diagram of a substrate etching system or bevel etcher 200 for cleaning the bevel edge of a substrate 218 wherein embodiments disclosed herein may be practiced. Details of exemplary bevel etchers can be found in commonly-assigned U.S. Pat. Nos. 7,943,007, and 7,858,898, and U.S. Published Application No. 2011/0206833 which are incorporated by reference herein in their entirety. The bevel etcher 200 has a generally, but not limited to, axisymmetric shape and, for brevity, only half of the side cross sectional view is shown in FIG. 2. In an embodiment, the bevel etcher 200 can include a chamber wall 202 having a door or gate 242 through which the substrate 218 can be loaded/unloaded, an upper electrode assembly 204, a support 208 from which the upper electrode assembly 204 is suspended, and a lower electrode assembly

206. The support 208 moves the upper electrode assembly 204 up and down (in the direction of the double arrow) for loading/unloading the substrate 218, and further, the support 208 can move the upper electrode assembly 204 up and down for adjusting the bevel etch distance during processing by adjusting the vertical height of an adjustable gap (gap spacing) between a lower horizontal portion of a tunable upper PEZ ring 302 included in the upper electrode assembly 204 and an upper surface of the substrate 218. Of course in an alternate embodiment, the lower electrode assembly 206, and/or both the lower electrode assembly 206 and the upper electrode assembly 204 can be configured to move up and down to adjust the vertical height of an adjustable gap between a lower horizontal portion of a tunable upper PEZ ring 302 included in the upper electrode assembly 204 and an upper surface of the substrate 218. A precision driving mechanism (not shown in FIG. 2) is attached to the support 208 so that the gap spacing between the upper electrode assembly 204 and the substrate 218 can be controlled accurately. The precision driving mechanism is preferably connected to a controller configured to control the gap spacing.

Metal bellows 250 can be used to form a vacuum seal between the chamber wall 202 and support 208 while allowing the support 208 to have a vertical motion relative to the wall 202. The support 208 can have a center gas feed (passage) 212 and an edge gas feed (passage) 220. The gas feeds 212, 220 provide buffer gas and process gas to be energized into plasma to clean the bevel edge. During operation, the plasma is formed around the bevel edge of the substrate 218 and has a generally ring shape. To prevent the plasma from reaching the central portion of the substrate 218, the vertical height of the adjustable gap between a dielectric component 216 and the tunable upper PEZ ring 302 surrounding the dielectric component 216 of the upper electrode assembly 204 and an upper surface of the substrate 218 is controlled and the process gas is fed from the center feed, preferably through a stepped hole 214. Then, the gas passes through the adjustable gap between the upper electrode assembly 204 and the substrate 218 in the radial direction of the substrate 218. Each gas feed is used to provide the same process gas or other gases, such as buffer gas and/or purge gas. The plasma/process gas is withdrawn from the chamber space 251 to the bottom space 240 via a plurality of holes (outlets) 241. During a bevel cleaning operation, the chamber pressure is typically in the range of 500 mTorr to 2 Torr, e.g., a vacuum pump 243 can be used to evacuate the bottom space 240 during a cleaning operation.

The upper electrode assembly 204 includes: the upper dielectric component or upper dielectric component 216; and an upper metal component 210 secured to the support 208 by a suitable fastening mechanism and grounded via the support 208. The upper metal component 210 is formed of a metal, such as aluminum, and may be anodized. The upper metal component 210 can have one or more gas passageways or through holes 222a, 222b and an edge gas plenum 224, wherein the gas passageways 222a, 222b are coupled to the edge gas feed 220 for fluid communication during operation. The upper dielectric component 216 is attached to the upper metal component 210 and formed of a dielectric material, preferably, but not limited to, ceramic. If desired, the lower exposed surface of the upper dielectric component 216 may have a coating of $Y_2O_3$. While the upper dielectric component 216 is shown with a single center hole, the upper dielectric component 216 may have any suitable number of outlets, e.g., the outlets can be arranged in a showerhead hole pattern if desired.

The upper dielectric component 216 can include a gap sensor 274 for measuring the vertical gap between the upper and lower electrode assemblies 204, 206. A signal outputted from the gap sensor 274 (see FIG. 3) is transmitted via suitable circuitry to a controller 380 configured to control the precision driving mechanism for adjusting the vertical gap. The in-situ gap sensor can be any suitable sensor, such as a laser, inductive, capacitive, acoustic, or linear variable differential transformer (LVDT) sensor. In alternative embodiments, the gap sensor can be located either inside or outside the chamber wall 202, depending on the type of sensor.

The lower electrode assembly 206 can include a powered electrode 226 having an upper portion 226a and a lower portion 226b and operative to function as a vacuum chuck to hold the substrate 218 in place during a cleaning operation, lift pins 230 for moving the substrate 218 up and down, a pin operating unit 232, bottom dielectric ring 238 having an upper portion 238a and a lower portion 238b. In an alternate embodiment, the lower electrode assembly 206 can include an electrostatic chuck (ESC) for holding the substrate in place during a cleaning operation. Hereinafter, the term powered electrode refers to one or both of the upper and lower portions 226a, 226b. Likewise, the term bottom dielectric ring 238 refers to one or both of the upper and lower portions 238a, 238b. The powered electrode 226 is coupled to a radio frequency (RF) power source 270 to receive RF power during a cleaning operation.

The lift pins 230 move vertically within cylindrical holes or paths 231 and are moved between upper and lower positions by the pin operating unit 232 positioned in the powered electrode 226. The pin operating unit may include a housing around each lift pin to maintain a vacuum sealed environment around the pins. The pin operating unit 232 may include any suitable lift pin mechanism, such as a robot arm 233 (e.g., a horizontal arm having segments extending into each housing and attached to each pin) and an arm actuating device (not shown in FIG. 2). For brevity, only a tip portion of a segment of the robot arm is shown in FIG. 2. While three or four lift pins can be used to lift a substrate such as a 300 or 450 mm substrate, any suitable number of pins 230 may be used in the bevel etcher 200. Also, any suitable mechanisms, such as lifter bellows, can be used as the pin operating unit 232.

The substrate 218 can be mounted on a configurable lower PEZ ring 260. In an embodiment, the top surface of the powered electrode 226, the bottom surface of the substrate 218, and inner periphery of the configurable lower PEZ ring 260 form an enclosed vacuum region recess (vacuum region) 219 in fluid communication with a vacuum source such as a vacuum pump 236 for supporting the substrate 218 during processing, however in an alternate embodiment, an ESC can be used to electrostatically clamp the substrate 218 to an upper surface of the lower electrode assembly 206. The cylindrical holes or paths for the lift pins 230 are also shared as gas passageways, through which the vacuum pump 236 evacuates the vacuum region 219 during operation. The powered electrode 226 includes a plenum 234 to reduce temporal pressure fluctuations in the vacuum region 219 and, in cases where multiple lift pins are used, to provide a uniform suction rate for the cylindrical holes.

On the top surface of the substrate 218 are integrated circuits previously formed by a series of processes. One or more of such processes may be performed by use of plasma that may transfer heat energy to the substrate 218, developing thermal stress on the substrate 218 and thereby causing substrate bowing. During a bevel cleaning operation, the substrate bowing can be reduced by use of a pressure difference between the top and bottom surfaces of the substrate 218. The pressure in the vacuum region 219 is maintained under vacuum during operation by a vacuum pump 236 coupled to the plenum 234. By adjusting the gap spacing between the upper dielectric component 216 and the upper surface of the substrate 218, the gas pressure in the gap can be varied without changing the overall flow rate of the process gas(es). Alternatively, the gas pressure in the gap can be varied by changing the overall flow rate of the process gas(es) when a predetermined gap spacing is desired for predetermined bevel etching process. Thus, by controlling the gas pressure in the gap, the pressure difference between the top and bottom surfaces of the substrate 218 can be varied and thereby the bending force applied on the substrate 218 can be controlled.

The bottom dielectric ring 238 is formed of a dielectric material, such as ceramic including $Al_2O_3$, and electrically insulates the powered electrode 226 from the chamber wall 202. The lower portion 238b of the bottom dielectric ring can have a step (flange) 252 formed on the inner periphery of its upper surface to mate with a recess on a lower edge of the powered electrode 226. The lower portion 238b can have a step (flange) 254 formed on its outer periphery to mate with a stepped surface on the upper portion 238a of the bottom dielectric ring. The steps (flanges) 254, 252 align the bottom dielectric ring 238 with the powered electrode 226. The step (flange) 254 also forms a tortuous gap along the surface thereof to eliminate the direct line-of-sight between the powered electrode 226 and the chamber wall 202 thereby reducing the possibility of a secondary plasma strike between the powered electrode 226 and the chamber wall 202.

Figure 3:
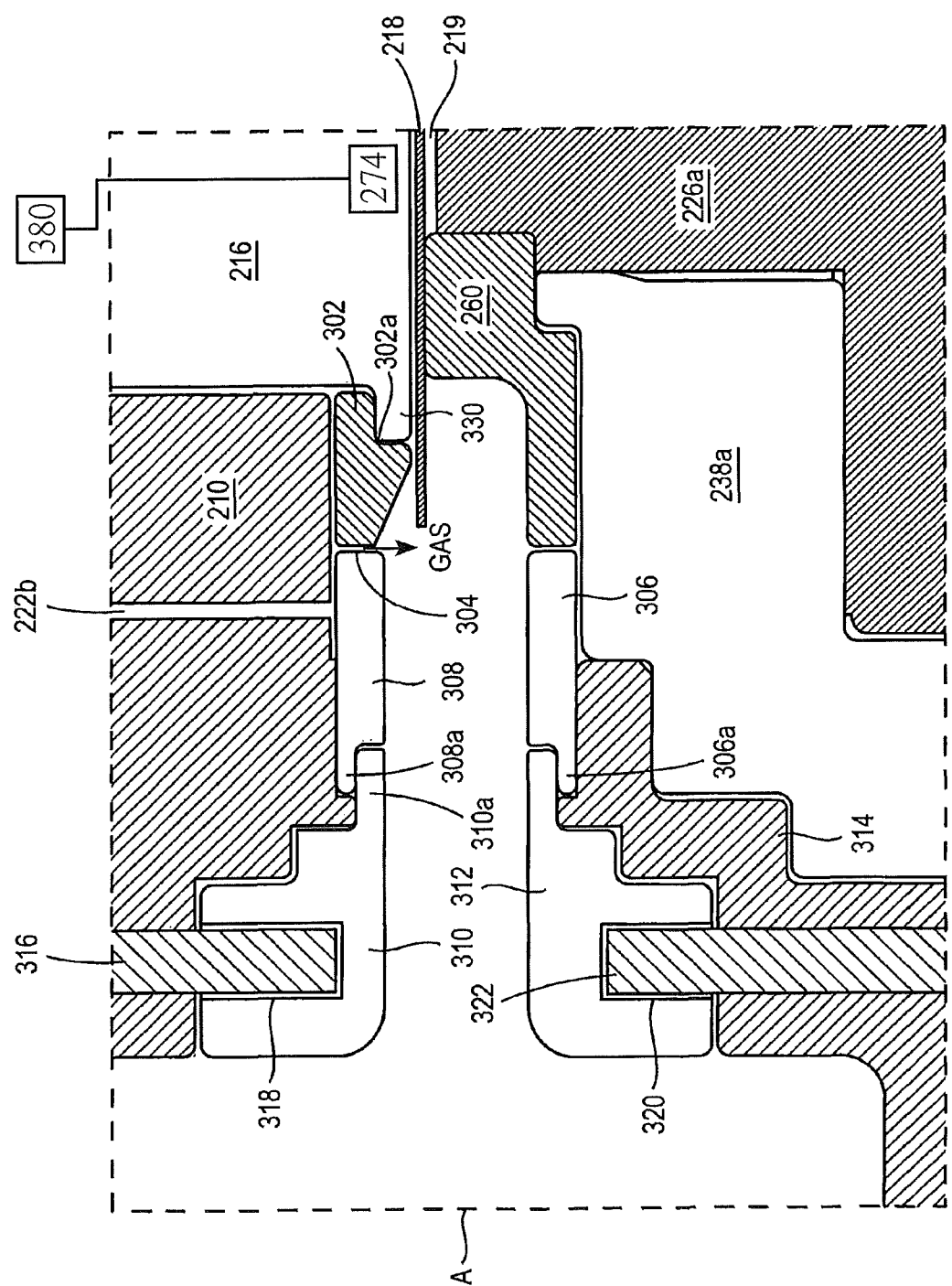
FIG. 3 illustrates a plasma bevel etcher according to embodiments disclosed herein.

FIG. 3 shows an enlarged schematic diagram of region A in FIG. 2. As depicted, the upper electrode assembly 204 includes three concentrically positioned rings: the tunable upper PEZ ring 302; an upper electrode ring 308 surrounding the tunable upper PEZ ring 302; and an outer upper dielectric ring 310 surrounding the upper electrode ring 308. The gap 304 between the tunable upper PEZ ring 302 and the upper electrode ring 308 can form a tortuous gas passageway connected to the gas passageway 222b. The tortuous gap 304 prevents the gas passageway 222b from being directly exposed to plasma thereby preventing formation of secondary plasma or plasma light-up within the edge gas passageway 222b. Such secondary plasma could erode the inner wall of the edge gas passageway 222b and result in need of frequent replacements of the upper metal component 210 as well as introduce eroded material to the substrate 218.

The tunable upper PEZ ring 302 can have a flange 302a formed on its inner surface, wherein the flange 302a on the inner surface engages a flange 330 of the upper dielectric component 216 to clamp the ring 302 against metal component 210. The tunable upper PEZ ring 302 may also need to be replaced more frequently than the other parts of the upper electrode assembly 204 due to plasma erosion and is considered a consumable component. Typically, process gases may include an oxygen-containing gas, such as $O_2$. Small amounts, such as but not limited to about <10%, of a fluorine-containing gas, such as $CF_4$, $SF_6$, or $C_2F_6$, may also be added to clean the bevel edge. Plasma containing these reactive gases may erode the tunable upper PEZ ring 302, and thereby necessitate periodic replacement of the tunable upper PEZ ring 302. For easy access to the tunable upper PEZ ring 302 during replacement, the tunable upper PEZ ring 302 can be held in place by the upper dielectric component 216 and can be replaced without removing the upper electrode assembly 204 from the chamber wall 202. For example, removal of the plate 216 can also allow the tunable upper PEZ ring 302 to be replaced with a different ring having the same or different diameter and geometry.

The tunable upper PEZ ring 302 prevents the plasma from directly eroding the upper dielectric component 216. The tunable upper PEZ ring 302 is formed of an electrically conductive, semiconductive or dielectric material, such as a ring entirely of aluminum oxide ($Al_2O_3$), aluminum nitride (AlN), silicon oxide ($SiO_2$), silicon carbide (SiC), silicon nitride ($Si_3N_4$), silicon (Si), yttria ($Y_2O_3$), or other materials, or it can be a composite ring of metal, ceramic, or polymer coated with a conductive or dielectric material such as Si, SiC or $Y_2O_3$, ceramic (preferably $Al_2O_3$), or pure material, such as CVD SiC (doped suitably to provide high resistivity), to reduce contamination of the substrate 218 during operation. To reduce the Cost-of-Consumables (CoC), the tunable upper PEZ ring 302 preferably has a small and simple cross section. The tunable upper PEZ ring 302 may be formed of a material having a high electrical resistance, preferably, but not limited to, about 105 ohm-cm. As the electrical coupling between the powered electrode 226 and the upper electrode ring 308 is affected by the electrical properties of the tunable upper PEZ ring 302, the plasma characteristics in the vicinity of the bevel edge can be controlled by varying the material, location, and/or configuration of the tunable upper PEZ ring 302.

The upper electrode ring 308 can be connected to and grounded via the upper metal component 210. Instead of using threaded fastening mechanisms, such as bolts, the upper electrode ring 308 can preferably be held in place by the clamping force of the outer upper dielectric ring 310. For example, electrode ring 308 can have a flange 308a which mates with flange 310a on the dielectric ring 310. As such, plasma contaminants that would otherwise originate from the erosion of the exposed fastening mechanisms can be obviated. The upper electrode ring 308 can preferably be formed of a metal, such as anodized aluminum. In some cases, the upper electrode ring 308 can be formed of pure materials such as Si (single crystal or polycrystalline silicon), CVD low resistivity SiC or any suitable high-purity conductive materials. To minimize the cost impact of using high-purity materials, the cross sectional dimension of the upper electrode ring 308 can be minimized. Although a bolt-through design could be used, a clamp-in-place design simplifies the configuration of the upper electrode ring 308 to thereby lower the CoC and allow the use of a wider range of materials for contamination control. It is also noted, that in alternate embodiments, the upper electrode ring 308, and further a lower electrode ring 306 located below the upper electrode ring 308, may be formed of graphite or various carbon based materials.

The outer upper dielectric ring 310 is formed of a dielectric material, such as $Al_2O_3$, and may be coated with $Y_2O_3$. The outer upper dielectric ring 310 includes circumferentially spaced apart threaded holes 318 in its upper surface to receive bolts 316 for securing the outer upper dielectric ring 310 to the upper metal component 210. The outer upper dielectric ring 310 includes a protrusion or step (flange) 310a that is used to clamp a flange 308a of the upper electrode ring 308 to the upper metal component 210. It is noted that each bolt 316 is screwed from the top side of the upper electrode assembly 204 so that the bolts are not exposed to and eroded by the plasma. The inner edge diameter of the outer upper dielectric ring 310 determines the outer diameter of the ring or donut shaped plasma.

The lower electrode assembly 206 can include a lower metal liner (collar) 314 which surrounds the upper portion 238a of the dielectric ring and three concentrically positioned rings: the configurable lower PEZ ring 260; the lower electrode ring 306 surrounding the configurable lower PEZ ring 260; and an outer lower dielectric ring 312 surrounding the lower electrode ring 306. The configurable lower PEZ ring 260, lower electrode ring 306, and lower metal liner 314 can be supported by the bottom dielectric ring 238 (more specifically, the upper portion 238a of the bottom dielectric ring) and liner 314. The lower electrode ring 306 can be clamped against an upper surface of the lower metal liner 314 by the outer lower dielectric ring 312, wherein the lower metal liner 314 is connected to the chamber wall 202 for grounding. The upper portion 238a of the bottom dielectric ring 238 electrically separates the lower electrode ring 306 from the upper portion 226a of the powered electrode.

The powered electrode 226 is preferably formed of a metal, such as anodized aluminum. If the powered electrode 226 is exposed to and eroded by the plasma in cases where high cleanness plasma is required, it would be desirable to use a high purity material for the electrode 226 to meet the cleanness requirement. Because the configurable lower PEZ ring 260 is designed to shield the powered electrode 226 from the plasma, the powered electrode 226 can be formed of lower purity metals or materials regardless of the cleanness requirement.

The configurable lower PEZ ring 260 protects the powered electrode 226 from attack by the plasma used to effect the bevel cleaning. The configurable lower PEZ ring 260 can be formed of an electrically conductive, semiconductive, or dielectric material, such as a ring entirely of aluminum oxide ($Al_2O_3$), aluminum nitride (AlN), silicon oxide ($SiO_2$), silicon carbide (SiC), silicon nitride ($Si_3N_4$), silicon (Si), yttria ($Y_2O_3$), or other materials or it can be a composite ring of metal, ceramic or polymer coated with a conductive or dielectric material such as Si, SiC, or $Y_2O_3$, e.g., a ceramic (preferably $Al_2O_3$), or pure material, such as Si (single crystal or polycrystalline silicon), CVD high resistivity SiC or the like, to reduce contamination of the substrate 218 during a cleaning operation. The configurable lower PEZ ring 260 may be also formed of a material having a high electrical resistance, preferably, but not limited to, about 105 ohm-cm. As the electrical coupling between the powered electrode 226 and the lower electrode ring 306 is affected by the electrical properties of the configurable lower PEZ ring 260, the plasma characteristics can be controlled by varying the material and/or configuration of the configurable lower PEZ ring 260.

The lower electrode ring 306 can be connected to and grounded via the lower metal liner 314. However, in an alternate embodiment, the lower electrode assembly 206 can include a lower support (not shown) in place of the powered electrode 226, and the lower electrode ring 306 can be coupled to an RF power source via the lower metal liner 314 wherein the upper electrode ring 308 can be grounded. Instead of using threaded fastening mechanisms, such as bolts, the lower electrode ring 306 is preferably held in place by the clamping force of the outer lower dielectric ring 312. For example, an outer flange 306a on the lower electrode ring 306 can be engaged with an inner flange 312a on the outer lower dielectric ring 312 whereby lower electrode ring 306 is clamped against the liner 314. As such, plasma contaminants that might otherwise originate from erosion of exposed fastening mechanisms can be obviated. The lower electrode ring 306 can preferably be formed of a metal, such as anodized aluminum. In some cases, the lower electrode ring 306 may be formed of high purity materials such as pure Si (e.g., single crystal or polycrystalline silicon), CVD low resistivity SiC or any suitable high-purity conductive materials. To minimize the cost impact of using high-purity materials, the cross sectional dimensions of the lower electrode ring 306 can be minimized. Use of a clamp-in-place design simplifies the configuration of lower electrode ring 306 and thereby lowers the CoC through use of a wider range of materials for contamination control.

The outer lower dielectric ring 312 is formed of a dielectric material, such as $Al_2O_3$, and may be coated with $Y_2O_3$. The outer lower dielectric ring 312 includes a series of threaded holes 320 which receive bolts 322 for securing the outer lower dielectric ring 312 to the lower metal liner 314. As discussed above, the outer lower dielectric ring 312 can include a protrusion or step (flange) that is used to clamp the lower electrode ring 306 to the metal liner 314. It is noted that the bolts 322 are screwed from the bottom side of the lower electrode assembly 206 so that the bolts 322 are not exposed to and eroded by the plasma. The inner edge diameter of the outer lower dielectric ring 312 determines the outer diameter of the ring or donut shaped plasma.

During operation, the RF power source 270 provides RF power to energize process gas provided through at least one of the gas feeds 212, 214 into plasma, wherein the RF power is supplied in one or more frequencies in a range, but not limited to, of about 2 MHz to about 60 MHz. In a variation, the upper electrode ring 308 can be coupled to an RF power source while the lower electrode ring 206 is grounded, or the lower electrode ring 206 can be coupled to an RF power source while the upper electrode ring 308 is grounded.

It is noted that the embodiment in FIG. 2 has a center gas feed and edge gas feeds. However, the number of gas feeds may be varied to achieve a desired distribution of gas to the substrate and/or vicinity of the bevel edge. Also, the upper dielectric component may have any suitable number and disposition of gas feed holes.

Figure 4:
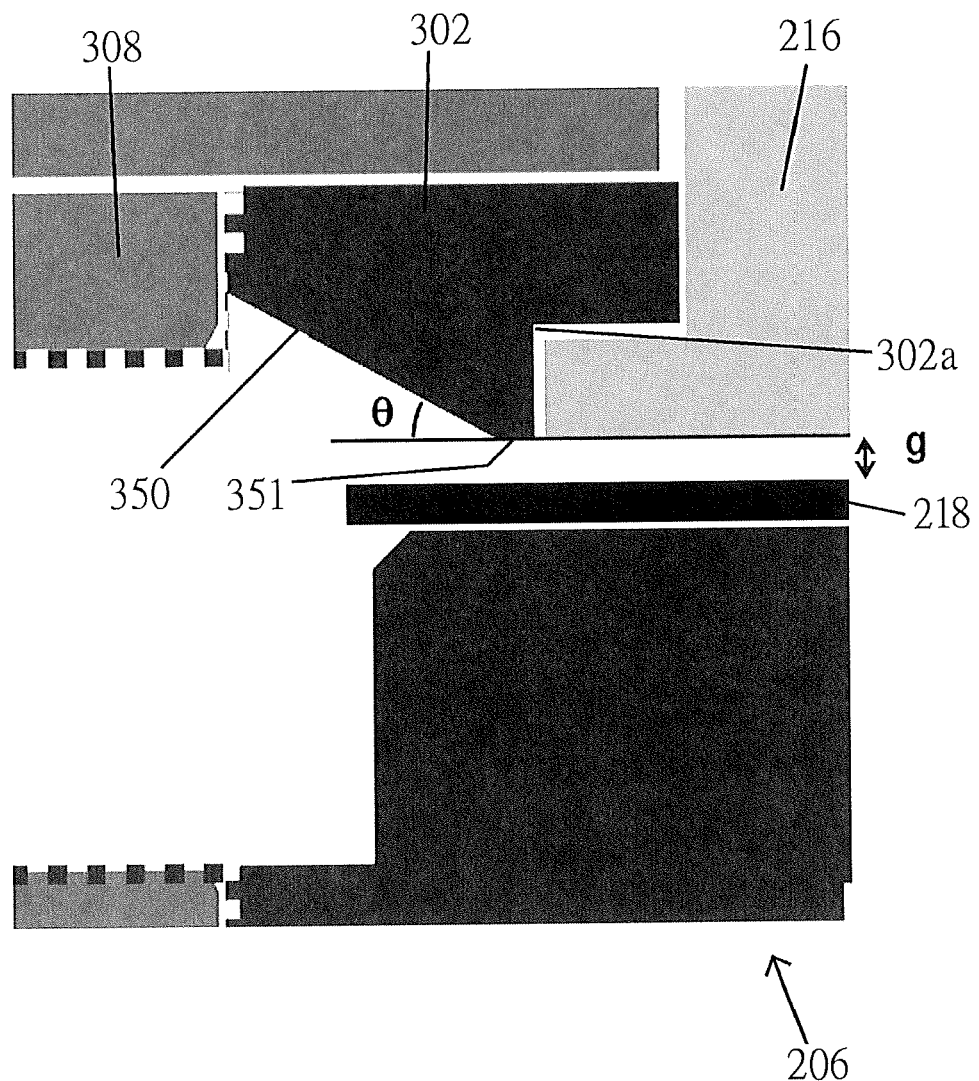
FIG. 4 illustrates a plasma bevel etcher according to embodiments disclosed herein.

FIG. 4 illustrates an embodiment of an upper electrode assembly 204 disposed above a lower electrode assembly 206 wherein the upper electrode assembly 204 includes a dielectric component 216, a tunable upper PEZ ring 302 surrounding the dielectric component 216, and an upper electrode ring 308 surrounding the tunable upper PEZ ring 302. The lower surface of the tunable upper PEZ ring 302 preferably has a horizontal portion 351 and an upwardly tapered portion 350 surrounding the horizontal portion 351 wherein the upwardly tapered portion 350 limits the extent of the bevel edge to be cleaned by the plasma depending on the angle θ of the taper and the gap spacing between the horizontal portion 351 of the tunable upper PEZ ring 302 and an upper surface of a substrate 218 supported on the lower electrode assembly 206, as well as the outer diameter of the horizontal portion 351 of the lower surface of the tunable upper PEZ ring 302. Preferably the upwardly tapered portion 350 is conical wherein the upward taper angle θ of the upwardly tapered portion 350 is about 5° to 50° with respect to the horizontal portion, and more preferably about 10° to 30° with respect to the horizontal portion, such as an upward taper angle of about 10°, an upward taper angle of about 20°, or an upward taper angle of about 30°. By selecting a desired taper angle for the upwardly tapered portion 350 the etch distance achieved by the bevel etcher during bevel etch processes can be varied by adjusting the gap spacing. In a preferred embodiment, the horizontal portion 351 of the lower surface of the tunable upper PEZ ring 302 is coplanar or substantially coplanar with a lower surface of the dielectric component 216. In another preferred embodiment, the slope of the upward taper angle θ is constant. In another preferred embodiment, an edge between the upwardly tapered outer portion and the horizontal portion of the lower surface of the tunable upper PEZ ring 302 is a rounded edge.

Figure 5:
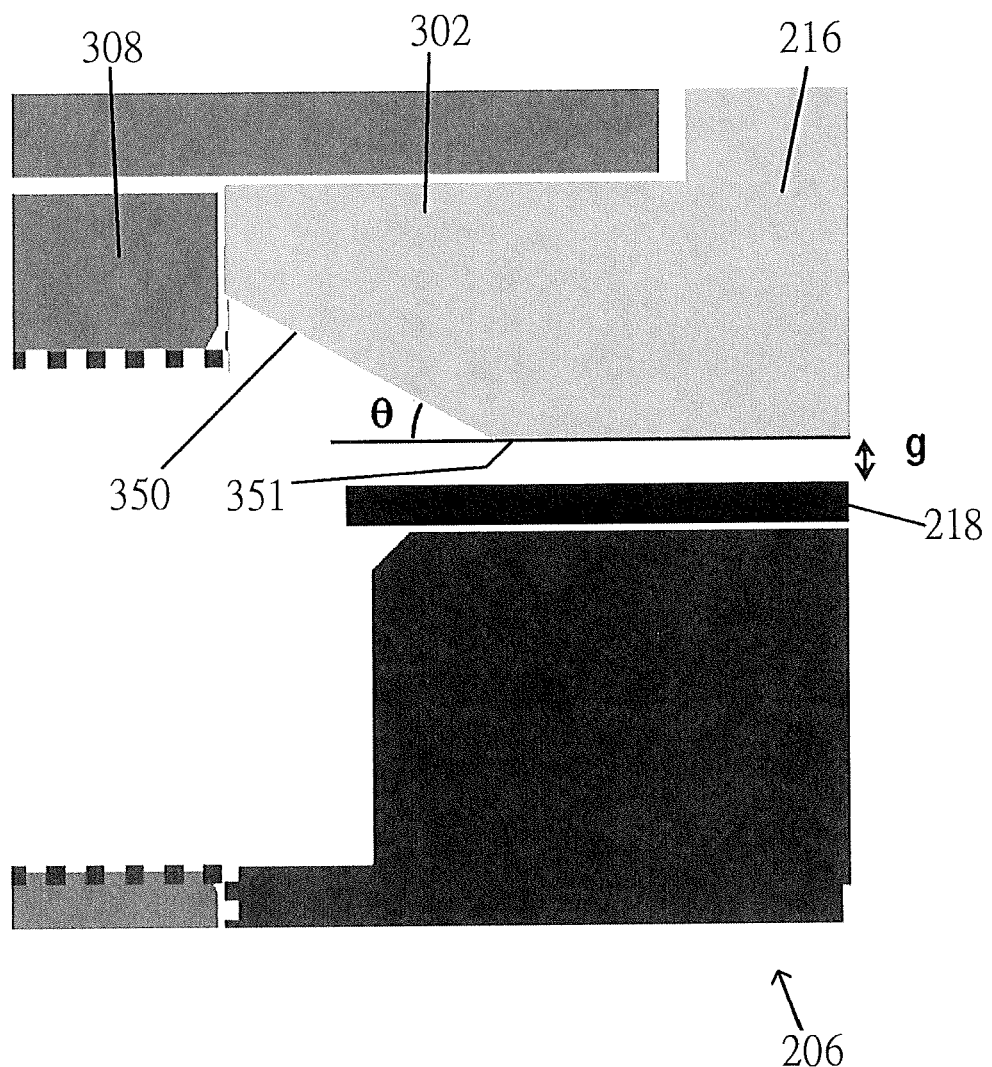
FIG. 5 illustrates a plasma bevel etcher according to embodiments disclosed herein.

In an alternate embodiment as shown in FIG. 5, the tunable upper PEZ ring 302 and the upper dielectric component 216 can be a monolithic piece.

Figure 6A:
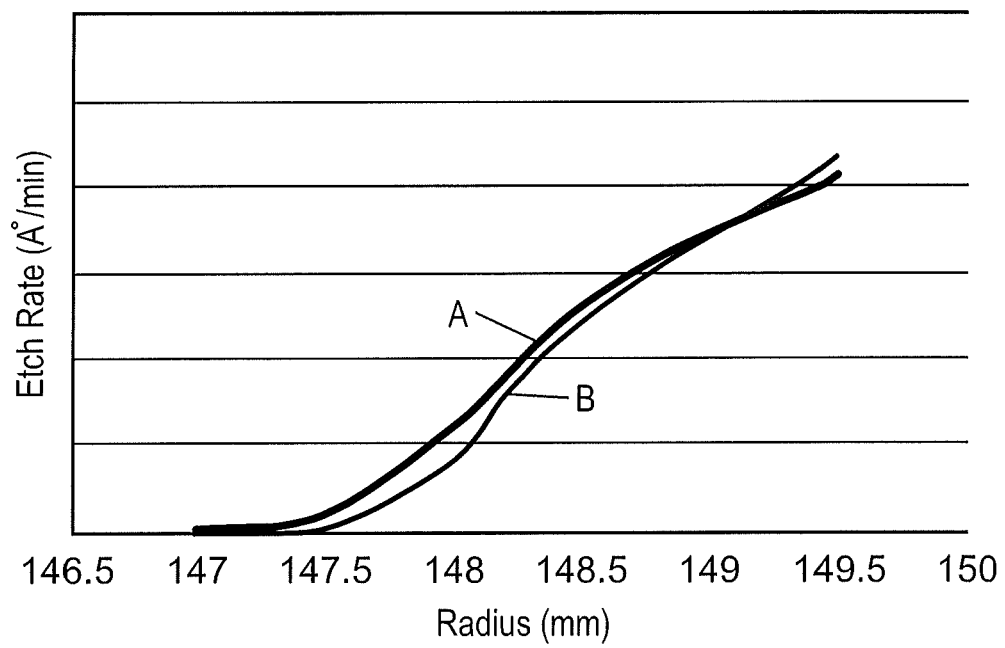
FIGS. 6A-6D show graphs of bevel etch rates along the radius of a 300 mm substrate according to embodiments disclosed herein.
Figure 6B:
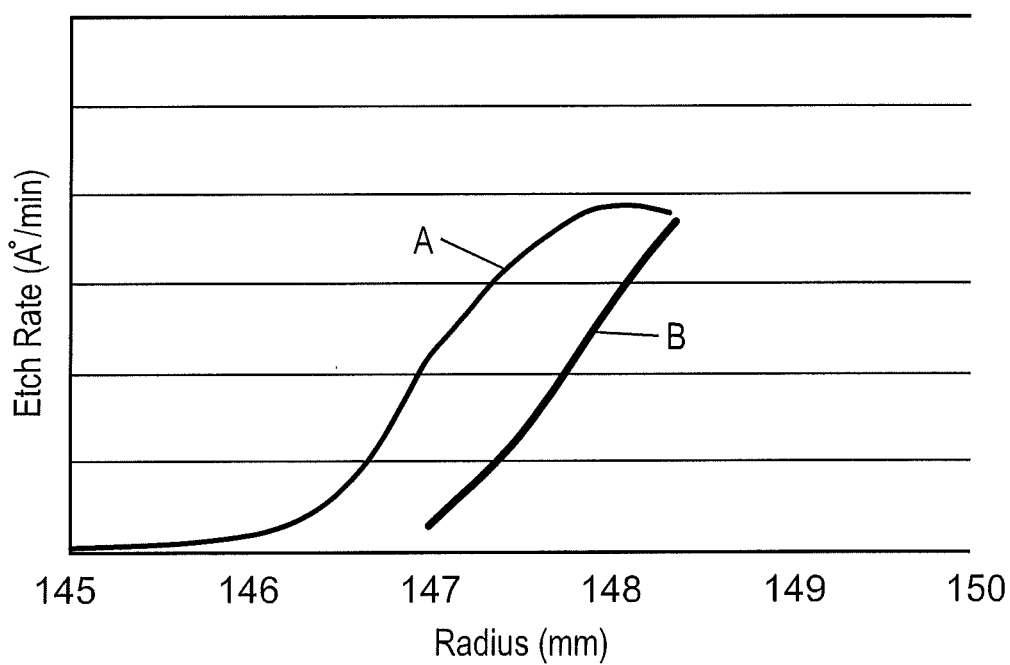
Figure 6C:
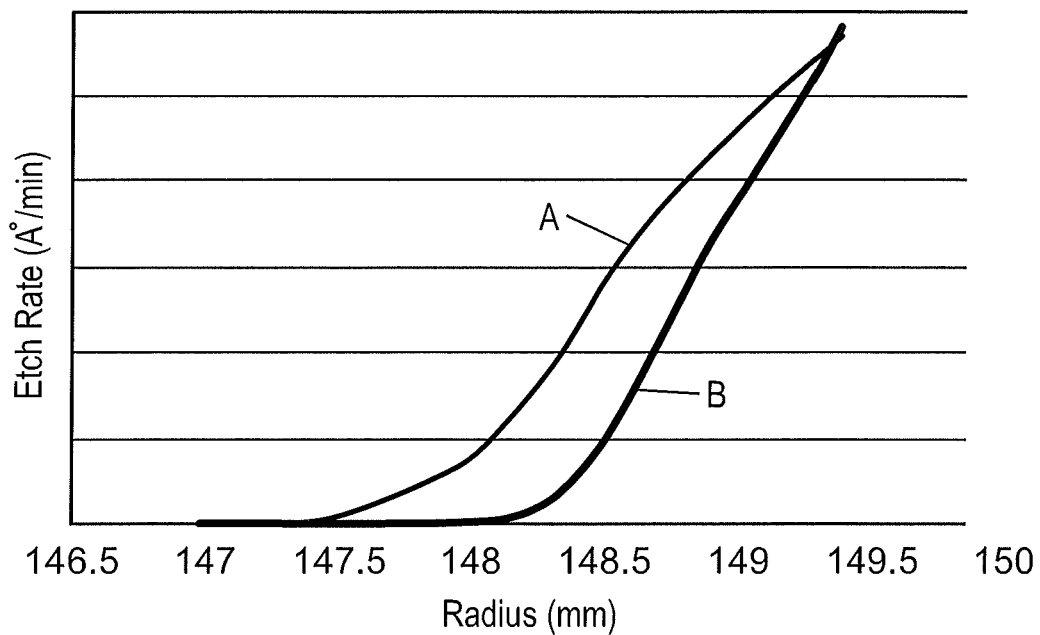
Figure 6D:
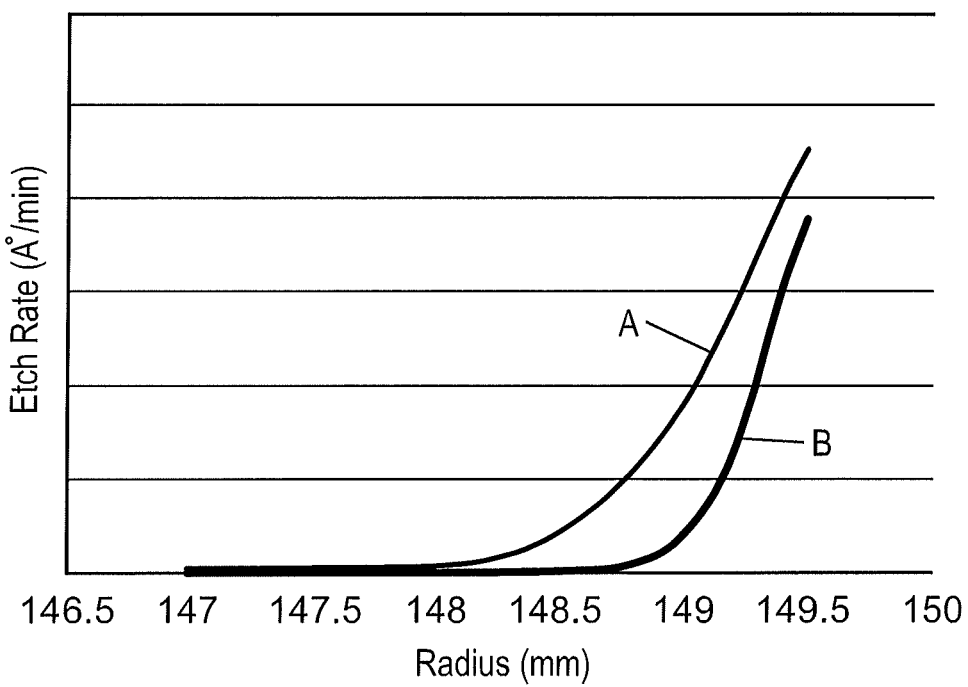

FIGS. 6A-6D graph the relationship between the upward taper angle θ of the upwardly tapered portion 350 of the lower surface of the upper PEZ ring 302 and the gap spacing between the horizontal portion 351 of the lower surface of the upper PEZ ring 302 and the upper surface of the substrate 218. FIG. 6A shows the etch rates along the radius of a 300 mm substrate for a non-tapered upper PEZ ring which has an outer diameter of a horizontal lower surface of 296.5 mm. Line A shows the etch rate for a gap spacing of about 0.3 mm, and line B shows the etch rate for a gap spacing of about 0.6 mm. The change in gap spacing leads to about a 0.20 mm variability in etch distance for the non-tapered upper PEZ ring. FIG. 6B shows the etch rates along the radius of a 300 mm substrate for a tapered upper PEZ ring according to embodiments disclosed herein wherein the tapered upper PEZ ring has an outer diameter of 304 mm. As shown in FIG. 6B, the tapered upper PEZ ring has an upward taper angle θ of about 20° with respect to the horizontal portion and the outer diameter of the horizontal portion of the lower surface is 295.6 mm. Line A shows the shows the etch rate for a gap spacing of about 0.15 mm, and line B shows the etch rate for a gap spacing of about 0.6 mm. The change in gap spacing leads to about a 1.1 mm variability in etch distance. FIG. 6C also shows the etch rates along the radius of a 300 mm substrate for a tapered upper PEZ ring according to embodiments disclosed herein wherein the tapered upper PEZ ring has an outer diameter of 304 mm. As shown in FIG. 6C, the tapered upper PEZ ring has an upward taper angle θ of about 30° with respect to the horizontal portion and the outer diameter of the horizontal portion of the lower surface is 295.6 mm. Line A shows the shows the etch rate for a gap spacing of about 0.3 mm and line B shows the etch rate for a gap spacing of about 0.6 mm. The change in gap spacing leads to about a 0.44 mm variability in etch distance. FIG. 6D shows the etch rates along the radius of a 300 mm substrate for a tapered upper PEZ ring according to embodiments disclosed herein wherein the tapered upper PEZ ring has an outer diameter of 304 mm. As shown in FIG. 6D, the tapered upper PEZ ring has an upward taper angle θ of about 45° with respect to the horizontal portion and the outer diameter of the horizontal portion of the lower surface is 298.5 mm. Line A shows the shows the etch rate for a gap spacing of about 0.3 mm and line B shows the etch rate for a gap spacing of about 0.6 mm. The change in gap spacing leads to about a 0.26 mm variability in etch distance.

Figure 7:
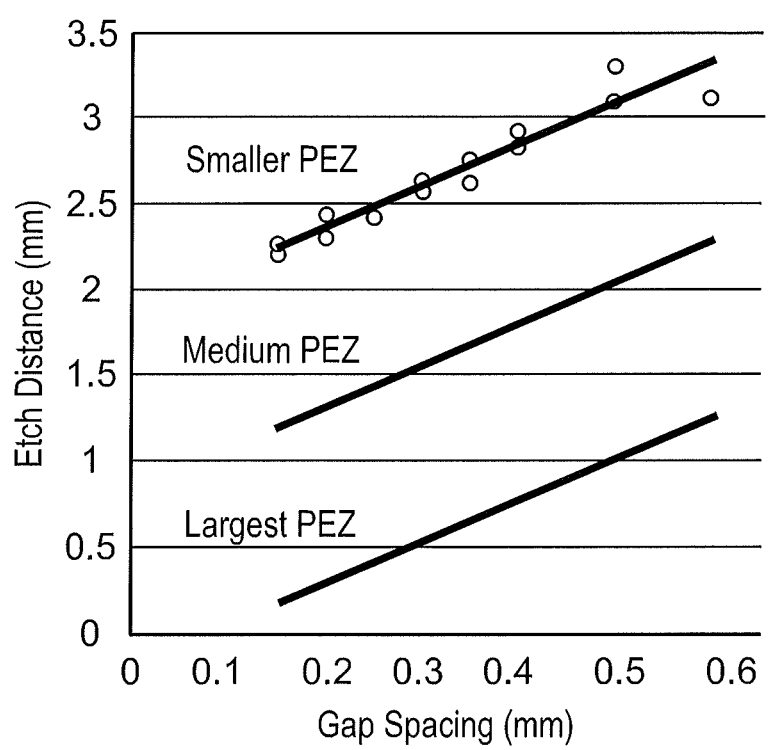
FIG. 7 shows a graph of etch distance variability for each of three tunable upper PEZ rings.

Further, to achieve greater control in covering a desired etch distance range, the outer radius of the horizontal portion 351 of the lower surface of the tunable upper PEZ ring can be selected to cover a range of etch distance requirements needed in any given series of bevel etching processes for various sized semiconductor substrates, such as substrates which have a diameter of 200 mm, 300 mm, or 450 mm. For example, in a series of bevel etching processes, 6 non-tapered upper PEZ ring configurations may be needed to cover an etch distance of about 0.3 mm to 2.3 mm. However, as shown in the graph of FIG. 7, this range can be covered with as little as three tunable upper PEZ rings, wherein a first tunable upper PEZ ring (A) can have an outer radius of the horizontal portion of the lower surface greater than a second tunable upper PEZ ring (B) and wherein the second tunable upper PEZ ring (B) can have an outer radius of the horizontal portion of the lower surface greater than a third tunable upper PEZ ring (C). For example, the first tunable upper PEZ ring (A) can be configured to adjust the etch distance from about 2 to 3 mm from the bevel edge apex towards the center of the substrate, the second tunable upper PEZ ring (B) can be configured to adjust the etch distance from about 1 to 2 mm from the bevel edge apex towards the center of the substrate, and the third tunable upper PEZ ring (B) can be configured to adjust the etch distance from about 0 to 1 mm from the bevel edge apex towards the center of the substrate, wherein the etch distance of each respective ring is adjusted by adjusting the vertical height of the adjustable gap between the horizontal portion of the lower surface of the tunable upper PEZ ring and the upper surface of the substrate.

During a series bevel etching processes, it may be preferable that the etch distance is varied between certain processes, such that desired portions a layers on a substrate may be removed, or alternatively, a passivation layer may be formed on the bevel edge. Using a tunable upper PEZ ring can allow for the varied etch distances to be achieved by adjusting the vertical height of an adjustable gap between the horizontal portion of the lower surface of the tunable upper PEZ ring and the upper surface of the substrate. For example, the vertical height of an adjustable gap between the tunable upper PEZ ring and the upper surface of the substrate can be set to a large gap setting to allow for the deposition of a passivation layer on the bevel edge of the substrate, the passivation layer can be subjected to an edge trimming step with a small gap setting, bevel cleaning can then be performed with a standard gap setting, and the passivation layer can be removed using an oxygen plasma with a large gap setting. An exemplary embodiment of a bevel etcher and a method of bevel etching a semiconductor substrate wherein the bevel etcher deposits a passivation layer on the bevel edge of the substrate can be found in commonly-assigned U.S. Published Application No. 2011/0146703 which is incorporated by reference herein in its entirety. Before a subsequent bevel etch process the vertical height of an adjustable gap can be reduced such that an edge portion of the previously deposited passivation layer can then be removed, thereby exposing an underlying film layer and/or etch byproduct adhered on the bevel edge of the substrate which was formed during previous etching or deposition processes. Removing an outer portion of the passivation layer allows the remaining portion of the passivation layer to act as a barrier, protecting the surface topography of the substrate during subsequent bevel edge cleaning processes. Then before a subsequent bevel etch process, the vertical height of the adjustable gap can be increased to a third predetermined height wherein previously deposited film or etch byproduct can then be removed. After the film or etch byproduct has been removed, the vertical height of the adjustable gap can be set to a next predetermined height wherein $O_2$ gas can then be used to strip the remaining passivation layer.

Further, a non-transitory computer machine-readable medium can comprise program instructions for control of the bevel etcher. The computer program code for controlling the processing operations can be written in any conventional computer readable programming language: for example, assembly language, C, C++, Pascal, Fortran or others. Compiled object code or script is executed by the processor to perform the tasks identified in the program.

The control system parameters relate to process conditions such as, for example, timing of the processing steps, flow rates and temperatures of process and inert gases, temperature of the substrate, pressure of the chamber, gap spacing, and other parameters of a particular process. These parameters are provided to the user in the form of a recipe, and may be entered utilizing the user interface.

Signals for monitoring the process may be provided by analog and/or digital input connections of the control system. The signals for controlling the process are output on the analog and digital output connections of the apparatus.

The system software may be designed or configured in many different ways. For example, various chamber component subroutines or control objects may be written to control operation of the chamber components necessary to carry out bevel edge cleaning processes. Examples of programs or sections of programs for this purpose include substrate timing of the processing steps code, flow rates and temperatures of precursors and inert gases code, a code for pressure control of the chamber, and a code for gap spacing.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A bevel etcher wherein a bevel edge of a 300 millimeter (mm) circular semiconductor substrate is subjected to plasma cleaning, comprising:
   a lower electrode assembly including a lower support having a cylindrical top portion;
   an upper dielectric component disposed above the lower electrode assembly having a cylindrical bottom portion opposing the top portion of the lower support;
   a tunable upper plasma exclusion zone (PEZ) ring surrounding the bottom portion of the upper dielectric component, wherein a lower surface of the tunable upper PEZ ring includes an upwardly tapered outer portion that is conical and that extends outwardly and upwardly from a horizontal portion of the lower surface of the tunable upper PEZ ring at an upward taper angle of about 5° to 50° with respect to the horizontal portion, wherein an outer diameter of the upwardly tapered outer portion is greater than 300 mm, and wherein an inner diameter where the upwardly tapered outer portion begins to extend upwardly is less than 300 mm;
   a controller configured to, during bevel edge cleaning of the 300 mm circular substrate, adjust an etch distance of plasma for cleaning the bevel edge of the 300 mm circular substrate at least one of radially inward and radially outward by at least one of increasing and decreasing, respectively, a vertical height of an adjustable gap between the lower surface of the upper PEZ ring and an upper surface of the 300 mm circular substrate supported on the lower support; and
   at least one radio frequency (RF) power source adapted to energize process gas into the plasma during the bevel edge cleaning.

2. The bevel etcher of claim 1, wherein the tunable upper PEZ ring and the upper dielectric component are a monolithic piece.

3. The bevel etcher of claim 1, wherein an edge between the upwardly tapered outer portion and the horizontal portion is a rounded edge.

4. The bevel etcher of claim 3, wherein (a) the horizontal portion of the lower surface of the tunable upper PEZ ring is coplanar or substantially coplanar with a lower surface of the bottom portion of the upper dielectric component.

5. A system comprising the bevel etcher of claim 1, wherein:
   (a) the controller is configured to control processes performed by the bevel etcher;
   (b) the system includes a non-transitory computer machine-readable medium comprising program instructions for control of the bevel etcher; and/or
   (c) the controller is configured to control a driving mechanism to control the vertical height of the adjustable gap.

6. The bevel etcher of claim 1, wherein
   (a) the tunable upper PEZ ring is formed of a material selected from the group consisting of an electrically conductive, semiconductive, dielectric, ceramic, and high electrical resistance material;
   (b) the tunable upper PEZ ring is formed from aluminum oxide, aluminum nitride, silicon oxide, silicon carbide, silicon nitride, silicon, yttria, or a mixture thereof; and/or
   (c) the tunable upper PEZ ring includes a coating of silicon, silicon carbide, yttria, or aluminum oxide on an outer surface thereof.

7. The bevel etcher of claim 1, wherein the upper dielectric component includes at least one gap sensor for measuring the vertical height of the adjustable gap wherein the gap sensor is one selected from the group consisting of inductive, laser, capacitive, acoustic, and linear variable differential transformer (LDVT) sensors.

8. The bevel etcher of claim 1, wherein the tunable upper PEZ ring includes a flange formed on an inner surface thereof.

9. The bevel etcher of claim 8, wherein the flange on the inner surface of the tunable upper PEZ ring engages a flange of the upper dielectric component to clamp the tunable upper PEZ ring against a metal component which is configured to support the upper dielectric component.

10. A system comprising:
    a tunable upper PEZ ring configured to adjust etch distance during bevel edge cleaning in a plasma bevel etcher wherein the tunable upper PEZ ring is configured to surround an upper dielectric component, the tunable upper PEZ ring comprising: a lower surface which includes an upwardly tapered outer portion that is conical and that extends outwardly and upwardly from a horizontal portion of the lower surface of the tunable upper PEZ ring at an upward taper angle of about 5° to 50° with respect to the horizontal portion, wherein an outer diameter of the upwardly tapered outer portion is greater than 300 mm, and wherein an inner diameter where the upwardly tapered outer portion begins to extend upwardly is less than 300 mm; and
    a controller configured to, during bevel edge cleaning of a 300 millimeter (mm) circular substrate, adjust the etch distance of plasma for cleaning the bevel edge of the 300 mm circular substrate at least one of radially inward and radially outward by at least one of increasing and decreasing, respectively, a vertical height of an adjustable gap between the lower surface of the upper PEZ ring and an upper surface of the 300 mm circular substrate supported on a lower support.

11. The tunable upper PEZ ring of claim 10, wherein the tunable upper PEZ ring and the upper dielectric component are a monolithic piece.

12. The tunable upper PEZ ring of claim 10, wherein an edge between the upwardly tapered outer portion and the horizontal portion is a rounded edge.

13. The tunable upper PEZ ring of claim 10, wherein
(a) the tunable upper PEZ ring is formed of a material selected from the group consisting of an electrically conductive, semiconductive, dielectric, ceramic, and high electrical resistance material;
(b) the tunable upper PEZ ring is formed from aluminum oxide, aluminum nitride, silicon oxide, silicon carbide, silicon nitride, silicon, yttria, or a mixture thereof;
(c) the tunable upper PEZ ring includes a coating of silicon, silicon carbide, yttria, or aluminum oxide on an outer surface thereof; and/or
(d) the tunable upper PEZ ring includes a flange formed on an inner surface thereof.

14. The tunable upper PEZ ring of claim 12, wherein (a) the horizontal portion of the lower surface of the tunable upper PEZ ring is configured to be coplanar or substantially coplanar with a lower surface of a bottom portion of the upper dielectric component.

15. A method of cleaning the bevel edge of a semiconductor substrate, comprising:
supporting a semiconductor substrate in a chamber of the bevel etcher according to claim 1;
adjusting a gap between the lower surface of the upper PEZ ring and an upper surface of the 300 mm circular substrate supported on the lower support to a vertical height wherein the vertical height determines the extent of the bevel edge of the 300 mm circular substrate to be cleaned by the plasma;
introducing a process gas into the chamber;
energizing the process gas into a plasma; and
cleaning the bevel edge with the plasma.

16. The method of claim 15, further comprising:
(a) increasing the vertical height of the gap thereby adjusting the etch distance radially inward, introducing a process gas into the chamber; energizing the process gas into a plasma, and cleaning the bevel edge with the plasma; or
(b) decreasing the vertical height of the gap thereby adjusting the etch distance radially outward, introducing a process gas into the chamber energizing the process gas into a plasma, and cleaning the bevel edge with the plasma.

17. The method of claim 15, wherein prior to cleaning the bevel edge with the plasma, depositing a passivation layer on the bevel edge of the 300 mm circular substrate.

18. A method of replacing the tunable upper PEZ ring in the bevel etcher according to claim 1, comprising detaching the upper dielectric component from an upper metal component of the bevel etcher, disengaging a flange on the dielectric component from a flange on the tunable upper PEZ ring, replacing the tunable upper PEZ ring with a new tunable upper PEZ ring by fitting the new tunable upper PEZ ring on the dielectric component and attaching the dielectric component to the upper metal component.

19. A bevel etcher wherein a bevel edge of a semiconductor substrate is subjected to plasma cleaning, comprising:
a lower electrode assembly including a lower support having a cylindrical top portion;
an upper dielectric component disposed above the lower electrode assembly having a cylindrical bottom portion opposing the top portion of the lower support;
a tunable upper plasma exclusion zone (PEZ) ring surrounding the bottom portion of the upper dielectric component, wherein a lower surface of the tunable upper PEZ ring includes an upwardly tapered outer portion that is conical and that extends outwardly and upwardly from a horizontal portion of the lower surface of the tunable upper PEZ ring at an upward taper angle of about 5° to 50° with respect to the horizontal portion of the lower surface of the tunable upper PEZ ring,
wherein an outer diameter of the upwardly tapered outer portion is greater than 300 mm, wherein an inner diameter where the upwardly tapered outer portion begins to extend upwardly is less than 300 mm, and wherein an edge between the upwardly tapered outer portion and the horizontal portion is a rounded edge; and
a controller configured to, during bevel edge cleaning of the substrate, at least one of increase and decrease a vertical height of an adjustable gap between the lower surface of the upper PEZ ring and an upper surface of the substrate supported on the lower support, wherein the extent of the bevel edge of the substrate to be cleaned by the plasma is adjusted via the combination of (i) the adjustment of the vertical height and (ii) the upwardly tapered outer portion radially; and
at least one radio frequency (RF) power source adapted to energize process gas into the plasma during a bevel edge cleaning process.

* * * * *